United States Patent
Ko et al.

(10) Patent No.: US 12,073,887 B2
(45) Date of Patent: Aug. 27, 2024

(54) SEMICONDUCTOR DEVICE PERFORMING BLOCK PROGRAM AND OPERATING METHOD THEREOF

(71) Applicant: SAMSUNG ELECTRONICS CO., LTD., Suwon-si (KR)

(72) Inventors: Sanggyu Ko, Suwon-si (KR); Yeongmin Yoo, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 17/744,942

(22) Filed: May 16, 2022

(65) Prior Publication Data
US 2023/0039489 A1   Feb. 9, 2023

(30) Foreign Application Priority Data
Aug. 4, 2021 (KR) .................. 10-2021-0102426

(51) Int. Cl.
*G11C 16/16* (2006.01)
*G11C 16/04* (2006.01)
*G11C 16/10* (2006.01)
*G11C 16/34* (2006.01)

(52) U.S. Cl.
CPC .......... *G11C 16/16* (2013.01); *G11C 16/0483* (2013.01); *G11C 16/107* (2013.01); *G11C 16/3404* (2013.01); *G11C 16/349* (2013.01); *G11C 2216/16* (2013.01); *G11C 2216/18* (2013.01)

(58) Field of Classification Search
CPC ............ G11C 16/16; G11C 16/0483; G11C 16/107; G11C 16/3404; G11C 16/349; G11C 2216/16; G11C 2216/18; G11C 7/14; G11C 11/5628; G11C 16/10; G11C 16/08; G11C 16/14; G06F 3/0658
See application file for complete search history.

(56) References Cited

U.S. PATENT DOCUMENTS

| | | | |
|---|---|---|---|
| 6,931,480 B2 | 8/2005 | Swaminathan | |
| 7,929,351 B2 | 4/2011 | Seol et al. | |
| 8,120,951 B2* | 2/2012 | Mouli | G11C 13/0014 365/163 |
| 9,240,241 B2 | 1/2016 | Costa et al. | |
| 9,786,378 B1 | 10/2017 | Zhang et al. | |
| 11,127,467 B1* | 9/2021 | Wang | G11C 16/08 |
| 2012/0314499 A1 | 12/2012 | Yuan et al. | |
| 2013/0322174 A1 | 12/2013 | Li et al. | |
| 2014/0269090 A1* | 9/2014 | Flynn | G11C 16/14 365/185.24 |
| 2018/0204621 A1 | 7/2018 | Kim et al. | |
| 2019/0198096 A1* | 6/2019 | Mirichigni | G11C 16/30 |

* cited by examiner

*Primary Examiner* — Donald H B Braswell
(74) *Attorney, Agent, or Firm* — Sughrue Mion, PLLC

(57) ABSTRACT

An operating method of a semiconductor device including a controller and a non-volatile memory device operating under control of the controller is provided. The operating method includes determining, by the controller, whether the non-volatile memory device satisfies a block program condition; based on the non-volatile memory device satisfying the block program condition, performing a block program operation a plurality of times; and based on the non-volatile memory device not satisfying the block program condition, performing an erase operation.

20 Claims, 13 Drawing Sheets

SEMICONDUCTOR DEVICE PERFORMING BLOCK PROGRAM AND OPERATING METHOD THEREOF

CROSS-REFERENCE TO RELATED APPLICATION

This application is based on and claims priority under 35 U.S.C. § 119 to Korean Patent Application No. 10-2021-0102426, filed on Aug. 4, 2021, in the Korean Intellectual Property Office, the disclosure of which is incorporated by reference herein in its entirety.

BACKGROUND

The present disclosure relates to a semiconductor device and an operating method of the semiconductor device, and more particularly, to a semiconductor device performing a block program and an operating method of the semiconductor device.

As the quaternary industry develops, demand for non-volatile memory devices that are capable of storing more data have increased in response to new information technology (IT) demand environments such as cloud service expansion, Internet of Things (IOT), and artificial intelligence (AI). Accordingly, in order to improve the degree of integration, scaling down of non-volatile memory devices continues.

Recently, as NAND flash memory devices in which a channel is vertically formed have been developed beyond the limit of two-dimensional (2D) structures, the degree of integration of NAND flash memory devices has been improved, but a problem with reliability has occurred due to a difference in structure. In particular, as the distance between cells decreases, lateral charge migration occurs, and due to this, the reliability of NAND flash memory devices deteriorates.

A retention characteristic, which is one of the indicators of the reliability of a NAND flash memory device, is an important indicator of how long data may be maintained without loss after the data is stored in a NAND flash memory device. Accordingly, there is a need for a semiconductor device having improved retention characteristics.

SUMMARY

One or more example embodiments provide a semiconductor device having improved retention characteristics by performing a block program.

One or more example embodiments also provide an operating method of a semiconductor device in which retention characteristics are improved by performing a block program.

Additional aspects will be set forth in part in the description which follows and, in part, will be apparent from the description, or may be learned by practice of the presented embodiments.

According to an aspect of an example embodiment, there is provided an operating method of a semiconductor device including a controller and a non-volatile memory device operating under control of the controller, the operating method including: determining, by the controller, whether the non-volatile memory device satisfies a block program condition; based on the non-volatile memory device satisfying the block program condition, performing a block program operation a plurality of times; and based on the non-volatile memory device not satisfying the block program condition, performing an erase operation.

According to an aspect of an example embodiment, there is provided a semiconductor device including: a controller including a metadata buffer configured to store metadata; and a non-volatile memory device configured to perform an operation based on control of the controller, wherein the controller is configured to determine whether the non-volatile memory device satisfies a block program condition, and the non-volatile memory device is configured to, based on the block program condition being satisfied, continuously perform a block program operation at least three times.

According to an aspect of an example embodiment, there is provided a non-volatile memory device including memory cells each storing data of at least two bits, wherein the non-volatile memory device is configured to: based on a block program condition being satisfied, continuously perform a block program operation a plurality of times by applying a block program voltage to memory cells in a selected memory block the plurality of times, and after the performing of the block program operation the plurality of times, perform a block erase operation by applying an erase voltage to a bulk of the memory cells in the selected memory block.

BRIEF DESCRIPTION OF THE DRAWINGS

Example embodiments will be more clearly understood from the following detailed description taken in conjunction with the accompanying drawings in which.

DETAILED DESCRIPTION

Figure 1:
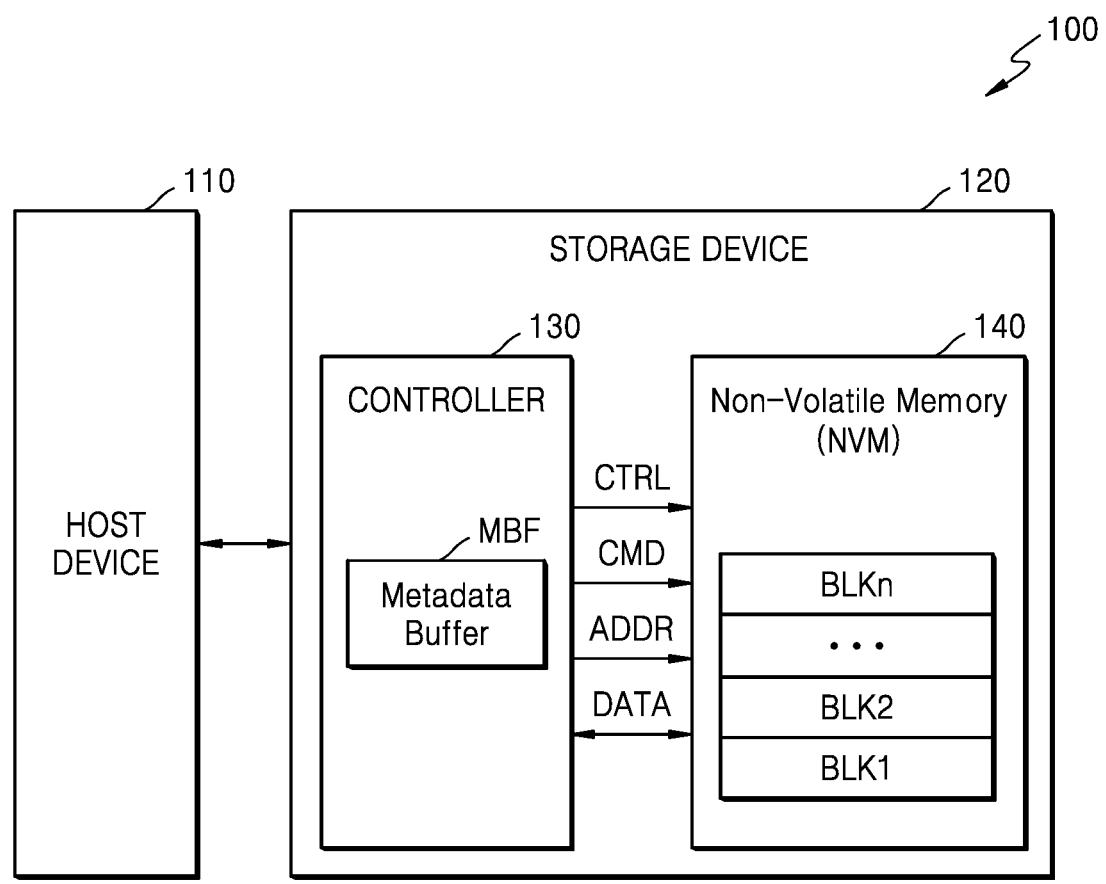
FIG. 1 is a block diagram of a memory system according to an example embodiment.

Hereinafter, example embodiments are described in detail with reference to the accompanying drawings. In describing with reference to the drawings, the same or corresponding components are given the same reference numerals, and redundant descriptions thereof are omitted.

FIG. 1 is a block diagram of a memory system 100 according to an example embodiment.

Referring to FIG. 1, the memory system 100 may include a host device 110 and a storage device 120.

The memory system 100 may be a data center composed of dozens of host machines or servers running hundreds of virtual machines. For example, the memory system 100 may be a computing device, such as a laptop computer, a desktop computer, a server computer, a workstation, a portable communication terminal, a personal digital assistant (PDA), a portable multimedia player (PMP), a smart phone, or a tablet personal computer (PC), a virtual machine, or a virtual computing device thereof. Alternatively, the memory system 100 may be a part of components included in a computing system, such as a graphics card. The memory system 100 is not limited to the hardware configuration described below, and other configurations are possible.

The host device 110 may refer to a data processing device capable of processing data. The host device 110 may execute an operating system (OS) and/or various applications. The host device 110 may include a central processing unit (CPU), a graphics processing unit (GPU), a neural processing unit (NPU), a digital signal processor (DSP), a microprocessor, or an application processor (AP). In an example embodiment, the memory system 100 may be included in a mobile device, and the host device 110 may be implemented as an AP. In an example embodiment, the host device 110 may be implemented as a system-on-a-chip (SoC), and accordingly, may be embedded in the memory system 100. The host device 110 may include one or more processors. The host device 110 may include a multi-core processor.

The host device 110 may be configured to execute one or more machine-executable instructions or pieces of software, firmware, or a combination thereof. The host device 110 may control a data processing operation for the storage device 120. For example, the host device 110 may control a data read operation, a program operation, an erase operation, and a block program operation of the storage device 120.

The host device 110 may communicate with the storage device 120 by using various protocols. For example, the host device 110 may communicate with the storage device 120 by using an interface protocol such as Peripheral Component Interconnect-Express (PCI-E), Advanced Technology Attachment (ATA), Serial ATA (SATA), Parallel ATA (PATA), or serial attached SCSI (SAS). In addition, various other interface protocols such as Universal Flash Storage (UFS), Universal Serial Bus (USB), Multi-Media Card (MMC), Enhanced Small Disk Interface (ESDI), and Integrated Drive Electronics (IDE) may be applied to a protocol between the host device 110 and the storage device 120.

The storage device 120 may include a controller 130 and a non-volatile memory device 140. The storage device 120 may be an internal memory embedded in an electronic device. For example, the storage device 120 may be a solid state drive or solid state disk (SSD), a universal flash storage (UFS), a memory card, a micro secure digital (SD) card, or an embedded multi-media card (eMMC). The storage device 120 may be an external memory detachable from the electronic device. For example, the storage device 120 may be a UFS memory card, a compact flash (CF) card, a secure digital (SD) card, a micro-SD card, a mini-SD card, an extreme digital (xD) card, or a memory stick. The storage device 120 may be referred to as a 'semiconductor device'.

The controller 130 may control all operations of the storage device 120. When power is applied to the storage device 120, the controller 130 may execute firmware. When the non-volatile memory device 140 is a NAND flash memory device, the controller 130 may execute firmware such as a flash translation layer (FTL) for controlling communication between the host device 110 and the storage device 120. For example, the controller 130 may receive data and a logical block address (LBA) from the host device 110, and may connect the LBA to a physical block address (PBA). The PBA may indicate an address of a memory cell in which the data is to be stored from among memory cells in the non-volatile memory device 140.

The controller 130 may process a request from the host device 110. The controller 130 may control the non-volatile memory device 140. The controller 130 may control the non-volatile memory device 140 to perform at least one of a program operation, a read operation, an erase operation, and a block program operation according to a request from the host device 110. Also, the controller 130 may control the non-volatile memory device 140 to perform an internal management operation or a background operation of the storage device 120 regardless of a request from the host device 110. The controller 130 may be implemented using a system on chip (SoC), an application specific integrated circuit (ASIC), a field programmable gate array (FPGA), or the like.

The controller 130 may include a metadata buffer MBF. The controller 130 may manage the metadata buffer MBF in units of memory groups. For example, the controller 130 may manage the metadata buffer MBF in units of memory blocks. Although the present example embodiment is illustrated as including one metadata buffer MBF, the embodiments are not limited thereto, and metadata may be classified and stored in a plurality of metadata buffers, respectively.

The metadata buffer MBF may include Synchronous Random Access Memory (SRAM), Dynamic Random Access Memory (DRAM), or Tightly Coupled Memory (TCM). FIG. 1 illustrates that the metadata buffer MBF is included in the controller 130, but is not limited thereto, and the metadata buffer MBF may be implemented outside the controller 130. The capacity of the metadata buffer MBF is smaller than the capacity of the non-volatile memory device 140, but the metadata buffer MBF may have improved waiting time, access time, and operation speed than the non-volatile memory device 140.

The metadata buffer MBF may store various types of metadata. The metadata buffer MBF may include information or programs for controlling or managing the non-volatile memory device 140, a mapping table indicating a relationship between a logical address of a host and a physical address of the non-volatile memory device 140, data to be stored in the non-volatile memory device 140, data output from the non-volatile memory device 140, information for managing a memory space of the non-volatile memory device 140, program and erase cycles P/E cycle of each memory block, an erase count EC of each memory block, deterioration degree information, a loop count LC, a block program flag BPF, the number of deteriorated memory cells found by performing a one-shot program operation, and the like. The erase count EC may be referred to as a 'program/erase count (E/P count)'.

The controller 130 may control the non-volatile memory device 140 so that each of a plurality of memory blocks BLK1 to BLKn performs a block program operation. For example, the controller 130 may manage (store and update) metadata (e.g., the erase count EC and the block program flag BPF), related to the deterioration degree management of the non-volatile memory device 140, in units of memory blocks. The deterioration degree may mean that physical characteristics of memory cells change as the program and erase cycles P/E cycle of the memory cells increase. As a memory cell deteriorates, durability and retention characteristics may deteriorate.

The non-volatile memory device 140 may perform a program operation, a read operation, an erase operation, and a block program operation under the control of the controller 130. FIG. 1 illustrates that the storage device 120 includes one non-volatile memory device 140, but is not limited thereto, and the storage device 120 may include a plurality of non-volatile memory devices. The non-volatile memory device 140 may include a NAND flash memory.

The non-volatile memory device 140 may include the plurality of memory blocks BLK1 to BLKn. Each of the plurality of memory blocks BLK1 to BLKn may be implemented as a memory cell array in which a plurality of memory cells have a two-dimensional (2D) or three-dimensional (3D) array structure. Each of the plurality of memory cells may be a NAND flash memory cell, but is not limited thereto, and the memory cell may be a resistive memory cell such as a resistive RAM (ReRAM) cell, a phase change RAM (PRAM) cell, or a magnetic RAM (MRAM) cell. Each of the plurality of memory blocks BLK1 to BLKn may be a unit of an erase operation and a block program operation.

The non-volatile memory device 140 may receive a write command (i.e., a command CMD), an address ADDR, a control signal CTRL, and data DATA from the controller 130, and may write data to memory cells corresponding to the address ADDR. The non-volatile memory device 140 may receive a read command (i.e., a command CMD) and an address ADDR from the controller 130, and may output data DATA, read from memory cells corresponding to the address ADDR, to the controller 130. The non-volatile memory device 140 may receive an erase command (i.e., a command CMD) and an address ADDR from the controller 130, and may erase data from memory cells corresponding to the address ADDR. The non-volatile memory device 140 may receive a block program command (i.e., a command CMD) and an address ADDR from the controller 130, and may perform a block program operation on memory cells corresponding to the address ADDR.

Although not shown in FIG. 1, the controller 130 may further include an error correction code unit (ECC). The ECC unit may provide accurate data by detecting and correcting errors in data input from the host device 110 or data output from the non-volatile memory device 140. Hereinafter, the non-volatile memory device 140 is described in detail with reference to FIG. 1.

Figure 2:
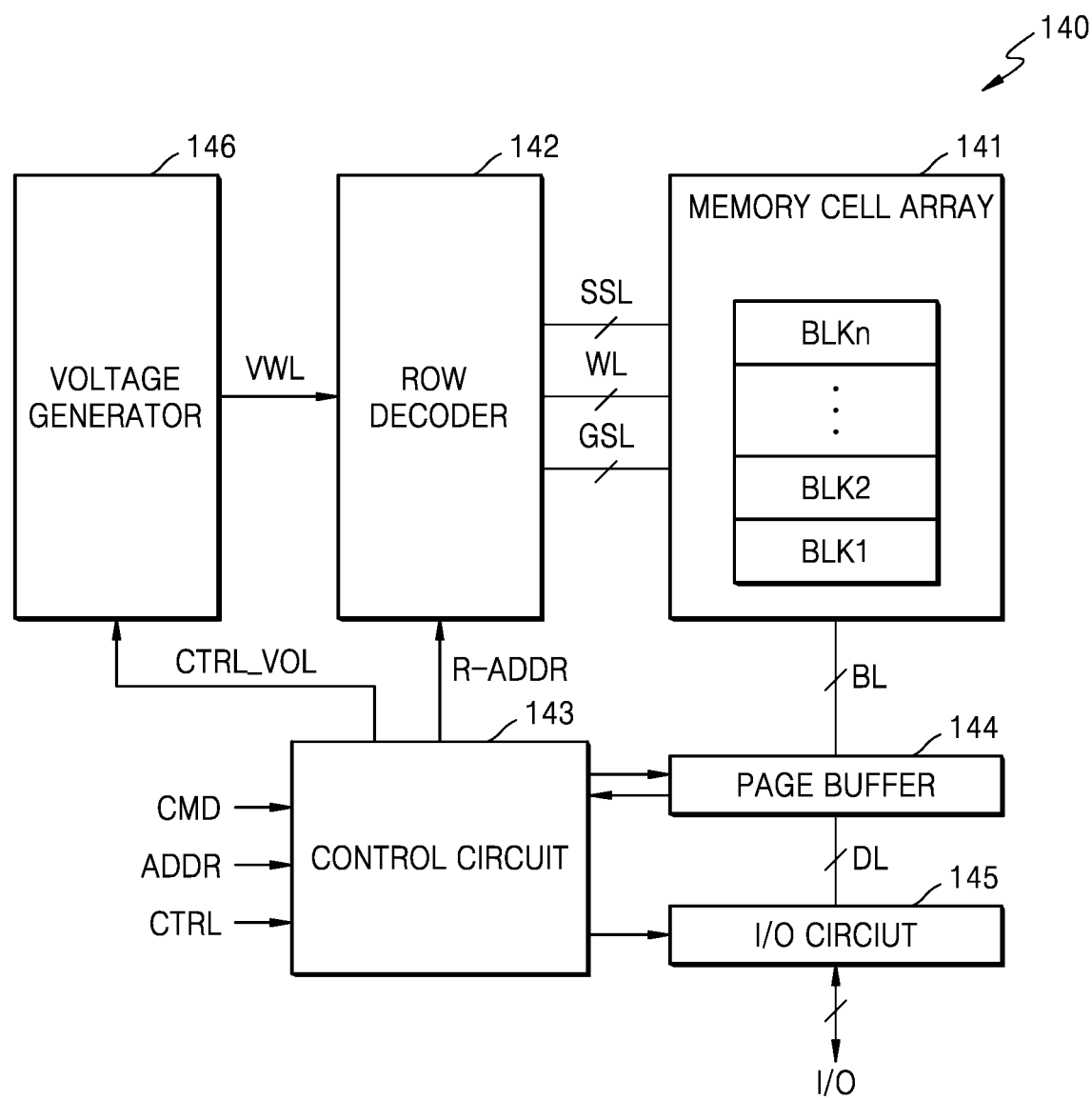
FIG. 2 is a block diagram of a non-volatile memory device according to an example embodiment.

FIG. 2 is a block diagram of a non-volatile memory device according to an example embodiment. In detail, FIG. 2 is a block diagram illustrating the non-volatile memory device 140 in FIG. 1.

Referring to FIG. 2, the non-volatile memory device 140 may include a memory cell array 141, a row decoder 142, a control circuit 143, a page buffer 144, an input/output circuit 145, and a voltage generator 146. Although not shown in FIG. 2, the non-volatile memory device 140 may further include an input/output interface.

The memory cell array 141 may be connected to word lines WL, string selection lines SSL, ground selection lines GSL, and bit lines BL. The memory cell array 141 may be connected to the row decoder 142 through the word lines WL, the string selection lines SSL, and the ground selection lines GSL, and may be connected to the page buffer 144 through the bit lines BL.

The memory cell array 141 may be a 3D memory cell array. The 3D memory cell array may be monolithically formed at at least one physical level of memory cell arrays having an active region arranged over a silicon substrate and circuitry formed on or within the silicon substrate as circuitry associated with the operation of memory cells. The term "monolithic" may mean that layers of each level constituting the 3D memory cell array are stacked directly on top of layers of each lower level of the 3D memory cell array. The 3D memory cell array may include NAND strings arranged in a vertical direction such that at least one memory cell is positioned on top of another memory cell. The at least one memory cell may include a charge trap layer. However, embodiments are not limited thereto, and in another embodiment, the memory cell array 141 may be a 2D memory cell array.

The memory cell array 141 may include a plurality of memory blocks BLK1 to BLKn. Each of the plurality of memory blocks BLK1 to BLKn may include a plurality of memory cells and a plurality of selection transistors. The plurality of memory cells may be connected to the word lines WL, and the plurality of selection transistors may be connected to the string selection lines SSL or the ground selection lines GSL. The plurality of memory cells may be NAND flash memory cells, but are not limited thereto.

Each of the plurality of memory blocks BLK1 to BLKn may have a 3D structure (or a vertical structure). Specifically, each of the plurality of memory blocks BLK1 to BLKn may include a plurality of NAND strings extending in a direction perpendicular to the substrate. However, embodiments are not limited thereto, and each of the plurality of memory blocks BLK1 to BLKn may have a 2D structure.

Each of the memory cells in the memory cell array 141 may be a multi-level cell (MLC) that stores two or more bits of data, a triple-level cell (TLC) that stores three-bit data, or a quad level cell (QLC) that stores four-bit data. Accordingly, each of the plurality of memory blocks BLK1 to BLKn may include at least one of a multi-level cell block including MLCs, a triple-level cell block including TLCs, and a quad-level cell blocks including QLCs. The memory cell array 141 is described in detail below with reference to FIGS. 3 and 4.

When a program voltage is applied to the memory cell array 141, a plurality of memory cells may be in a program state, and when an erase voltage is applied to the memory cell array 141, the plurality of memory cells may be in an erase state. In addition, when a block program voltage is applied to the memory cell array 141, the plurality of memory cells may be in a block program state. Each of the memory cells may have an erase state and at least one program state that are distinguished from each other according to a threshold voltage. For example, when the memory cell is an MLC, the memory cell may have an erase state and at least three program states. The operation of the memory cell array 141 is described in detail below with reference to FIGS. 8 to 10.

The row decoder 142 may select any one of the plurality of memory blocks BLK1 to BLKn in the memory cell array 141. The row decoder 142 may select any one of the word lines WL of a selected memory block. For example, during a program operation, the row decoder 142 may apply a program voltage and a verify voltage to a selected word line WL, and may apply a pass voltage to an unselected word line WL. The row decoder 142 may select some string selection lines from among the string selection lines SSL or some ground selection lines from among the ground selection lines GSL in response to a row address R-ADDR.

The control circuit 143 may output various internal control signals for performing program, block program, and erase operations on the memory cell array 141 based on the command CMD, the address ADDR, and the control signal CTRL, transmitted from the controller 130 in FIG. 1. The control circuit 143 may provide the row address R_ADDR to the row decoder 142, may provide a column address to the input/output circuit 145, and provide a voltage control signal CTRL_VOL to the voltage generator 146.

The page buffer 144 may operate as a write driver or a sense amplifier according to an operation mode. During a read operation, the page buffer 144 may sense a bit line BL of a selected memory cell under the control of the control circuit 143. Sensed data may be stored in a latch provided in the page buffer 144. Also, the page buffer 144 may dump data stored in the latch to the input/output circuit 145 through a data line DL under the control of the control circuit 143.

The input/output circuit 145 may temporarily store the command CMD, the address ADDR, and the data DATA provided from the outside of the non-volatile memory device 140 through an input/output line I/O. The input/output circuit 145 may temporarily store read data of the non-volatile memory device 140 and may output the read data to the outside through the input/output line I/O at a specified time.

The voltage generator 146 may generate various types of voltages for the memory cell array 141 to perform program, block program, read, and erase operations, based on the voltage control signal CTRL_VOL transmitted from the control circuit 143. Specifically, the voltage generator 146 may generate a word line voltage VWL, for example, a program voltage, a block program voltage, a read voltage, a pass voltage, an erase voltage, an erase verification voltage, and the like.

Figure 3:
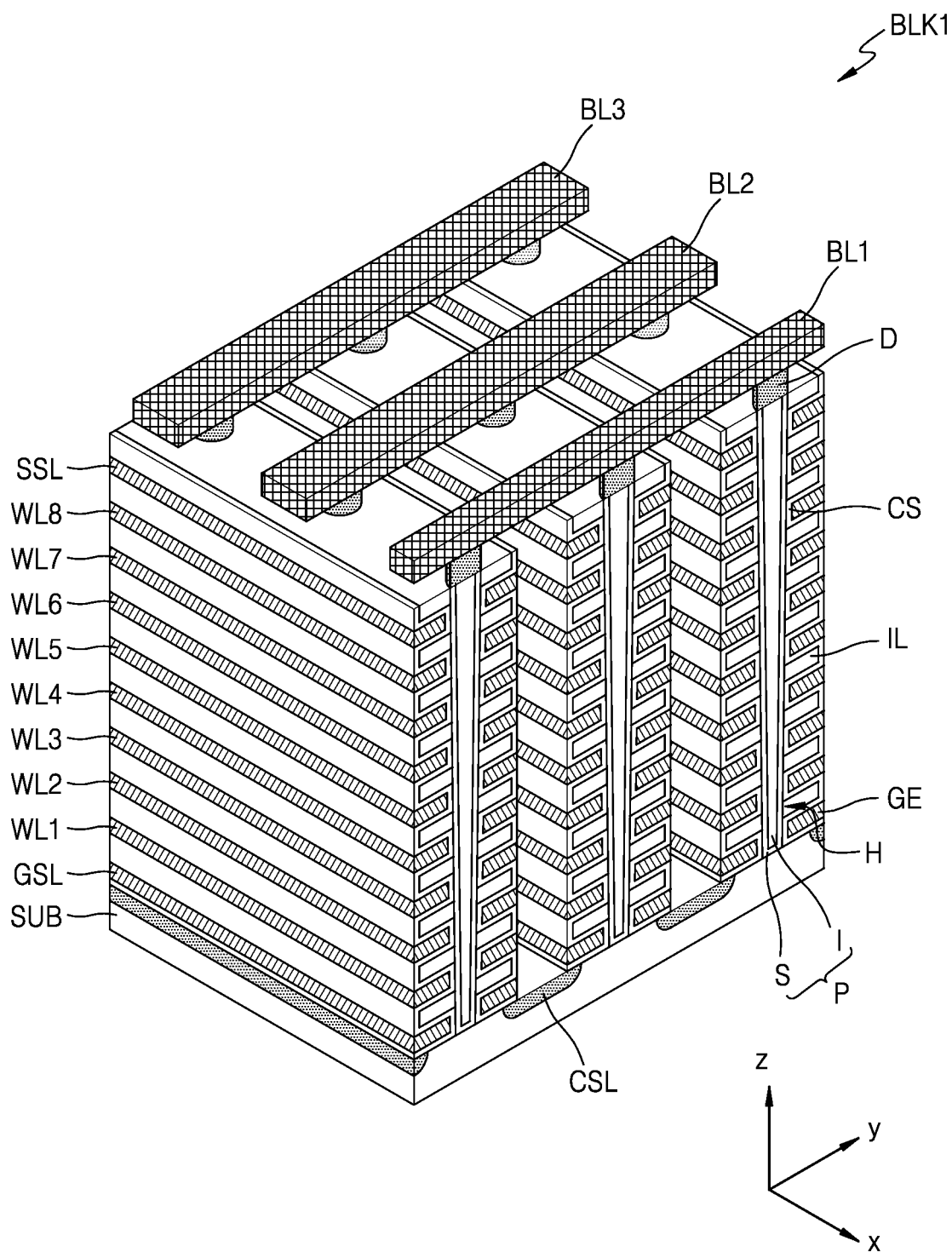
FIG. 3 is a perspective view illustrating a memory block according to an example embodiment.
Figure 4:
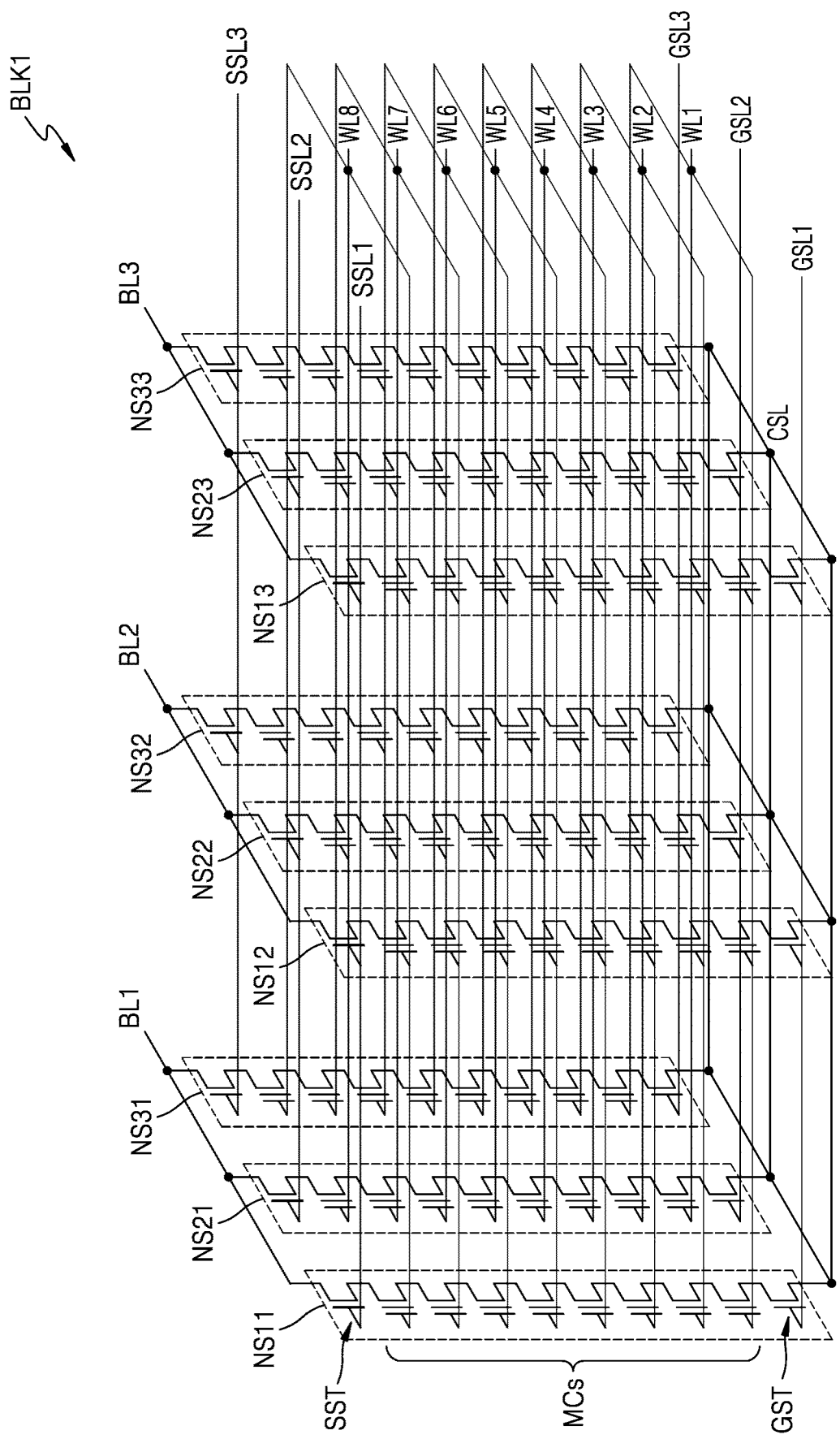
FIG. 4 is a circuit diagram of a memory block according to an example embodiment.

FIG. 3 is a perspective view illustrating a memory block according to an example embodiment. FIG. 4 is a circuit diagram illustrating an example of a memory block according to an example embodiment. In detail, FIGS. 3 and 4 are diagrams for describing a first memory block BLK1 among the plurality of memory blocks BLK1 to BLKn in FIGS. 1 and 2. Although the present example embodiment is described based on the first memory block BLK1, the other memory blocks BLK2 to BLKn may have the same structure as the first memory block BLK1. Hereinafter, descriptions are made with reference to FIGS. 1 and 2.

Referring to FIG. 3, the first memory block BLK1 is formed in a vertical direction with respect to a substrate SUB. The substrate SUB may have a first conductivity type (e.g., a p-type). The substrate SUB may be doped with impurities of a second conductivity type (e.g., an n-type), and a common source line CSL extending in a first direction x may be provided. The common source line CSL may function as a source region for supplying current to memory cells.

A plurality of insulating layers IL extending in a second direction y may be sequentially provided in a third direction z on a region of the substrate SUB between two adjacent common source lines CSL. The plurality of insulating layers IL may be apart from each other by a certain distance in the third direction z. For example, the plurality of insulating layers IL may include an insulating material such as silicon oxide.

A channel hole H may be formed on a region of the substrate SUB between two adjacent common source lines CSL, and the channel hole H may be filled with a surface layer S and an inner layer I. The surface layer S and the inner layer I, filled in the channel hole H, may have a pillar shape. Hereinafter, the surface layer S and the inner layer I, filled in the channel hole H, may be referred to as 'pillars' (P).

The channel hole H may be sequentially arranged in the first direction x and pass through the plurality of insulating layers IL in the third direction z.

The surface layer S may contact the substrate SUB. The surface layer S may function as a channel region. The surface layer S may include a silicon material having the first conductivity type (e.g., the p-type). For example, the surface layer S may include a silicon material having the same type as that of the substrate SUB.

The inner layer I may include an insulating material. For example, the inner layer I may include an insulating material such as silicon oxide. For example, the inner layer I may include an air gap.

A charge storage layer CS may be provided along exposed surfaces of the insulating layers IL, pillars P, and the substrate SUB in a region between two adjacent common source lines CSL. The charge storage layer CS may have an oxide-nitride-oxide (ONO) structure.

A gate electrode GE may be provided on an exposed surface of the charge storage layer CS in a region between two adjacent common source lines CSL.

A drain contact D may be provided on each of the pillars P. The drain contact D may include a silicon material doped with impurities having the second conductivity type. For example, the drain contact D may include n-type silicon, but is not limited thereto.

Bit lines BL1 to BL3 may be provided on the drain contact D. The bit lines BL1 to BL3 may extend in the second direction y and may be arranged to be apart from each other by a certain distance in the first direction x.

Referring to FIG. 4, the first memory block BLK1 may be a NAND flash memory having a vertical structure. The first memory block BLK1 may include NAND strings NS11 to NS33, word lines WL1 to WL8, the bit lines BL1 to BL3, ground selection lines GSL1 to GSL3, string selection lines SSL1 to SSL3, and a common source line CSL. In the present example embodiment, the number of NAND strings, the number of word lines, the number of bit lines, the number of ground selection lines, and the number of string selection lines may be variously changed according to an embodiment.

The NAND strings NS11, NS21, and NS31 may be provided between a first bit line, i.e., the bit line BL1 and the common source line CSL, the NAND strings NS12, NS22, and NS32 may be provided between a second bit line, i.e., the bit line BL2, and the common source line CSL, and NAND strings NS13, NS23, and NS33 may be provided between a third bit line, i.e., the bit line BL3, and the common source line CSL. Each NAND string (e.g., the NAND string NS11) may include a string selection transistor SST, a plurality of memory cells MCs, and a ground selection transistor GST, connected in series. Because the NAND strings NS11 to NS33 may have the same structure, a first NAND string, i.e., the NAND string NS11, is described below.

The NAND string NS11 may include the string selection transistor SST, the plurality of memory cells MCs, and the ground selection transistor GST, connected in series. The string selection transistor SST may be connected to the bit line BL1 corresponding thereto from among the bit lines BL1 to BL3, and the ground selection transistor GST may be connected to the common source line CSL. The string selection transistor SST may be connected to the string selection line SSL1 corresponding thereto from among the string selection lines SSL1 to SSL3, the plurality of memory cells MCs may be respectively connected to the word lines WL1 to WL8 corresponding thereto, and the ground selection transistor GST may be connected to the ground selection line GSL1 corresponding thereto from among the ground selection lines GSL1 to GSL3.

One physical page may correspond to a plurality of logical pages according to the number of data bits each stored in the memory cells MCs. For example, when the memory cells MCs are single-level cells (SLCs), one page may correspond to each of the word lines WL1 to WL8, and when the memory cells MCs are MLCs, TLCs, or QLCs, a plurality of pages may correspond to each of the word lines WL1 to WL8. For example, when the memory cells MCs are TLCs, one physical page may correspond to three logical pages, and the three logical pages may include a least significant bit (LSB) page, a central significant bit (CSB) page, and a most significant bit (MSB) page.

Although not shown in FIG. 4, the NAND string NS11 may include one dummy memory cell or a plurality of dummy memory cells between the string selection transistor SST and the memory cells MCs. The NAND string NS11 may include one dummy memory cell or a plurality of dummy memory cells between the ground selection transistor GST and the memory cells MCs. The NAND string NS11 may include one dummy memory cell or a plurality of dummy memory cells between the memory cells MCs. The dummy memory cells may have the same structure as the memory cells MCs and may not be programmed or may be programmed differently from the memory cells MCs.

Referring to FIGS. 3 and 4, as the charge storage layer CS is formed along exposed surfaces of the insulating layers IL, the pillars P, and the substrate SUB, all memory cells constituting a NAND string may share the charge storage layer CS. Accordingly, a lateral charge migration phenomenon in which charges move between adjacent memory cells may occur.

As the lateral charge migration phenomenon occurs, holes may be accumulated in the charge storage layer CS, and as electrons injected into the charge storage layer CS through a program operation recombine with the accumulated holes, desired data may not be programmed. In addition, when the lateral charge migration phenomenon occurs after the program operation is performed, a threshold voltage of the memory cells may gradually decrease, and thus, data stored in the memory cells may be lost. Accordingly, retention characteristics of the non-volatile memory device 140 may deteriorate.

Figure 5:
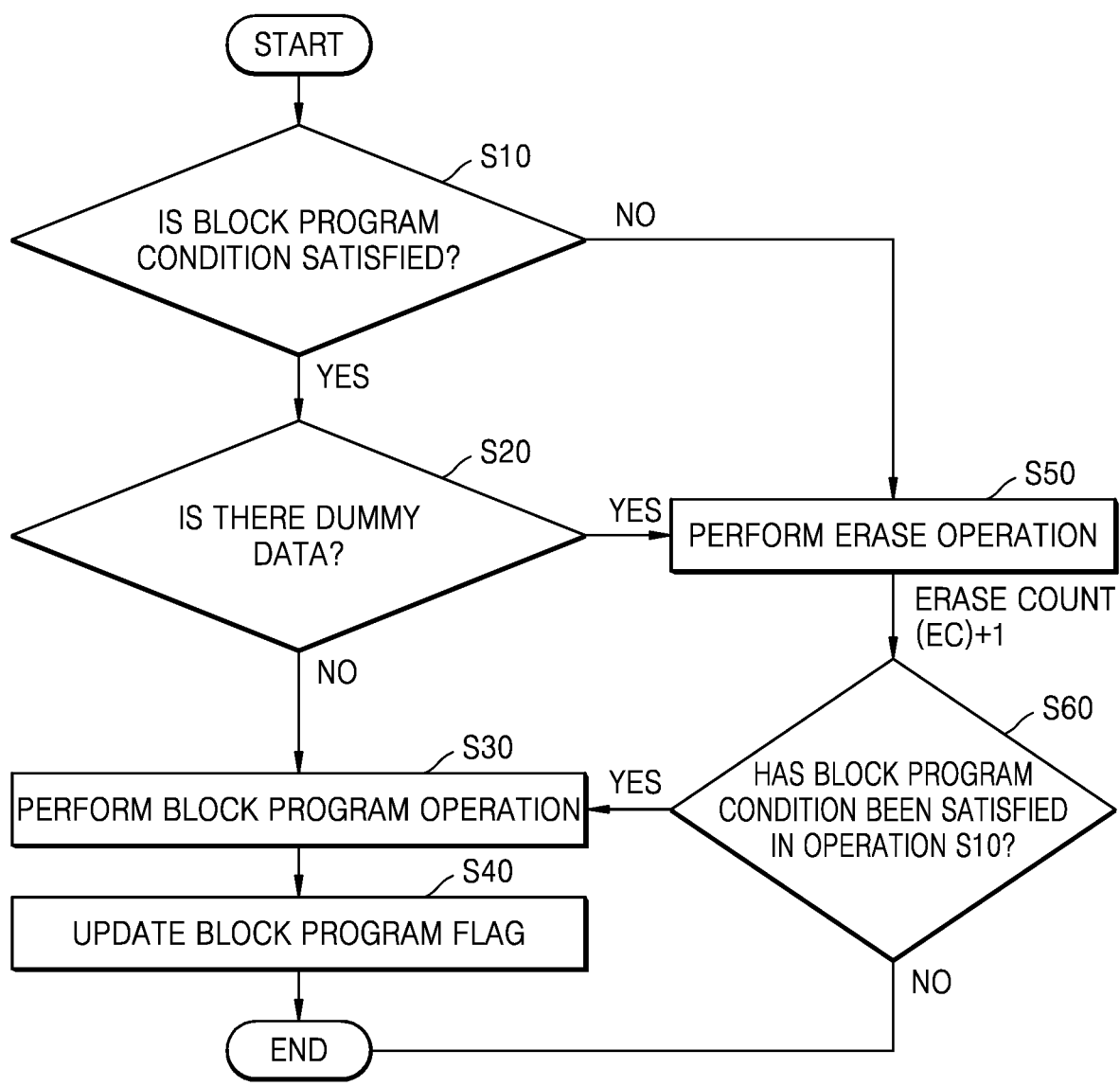
FIG. 5 is a flowchart illustrating an operating method of a storage device according to an example embodiment.
Figure 6:
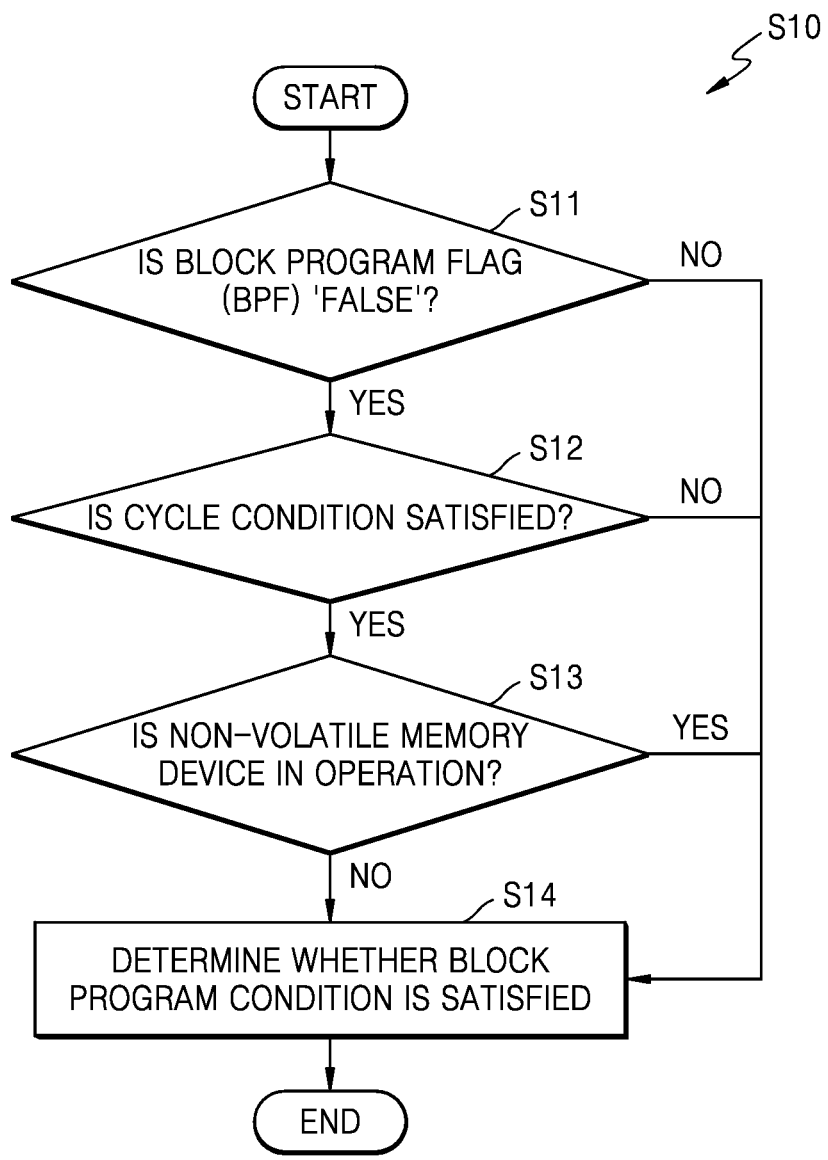
FIG. 6 is a flowchart illustrating an operating method of a storage device according to an example embodiment.
Figure 10:
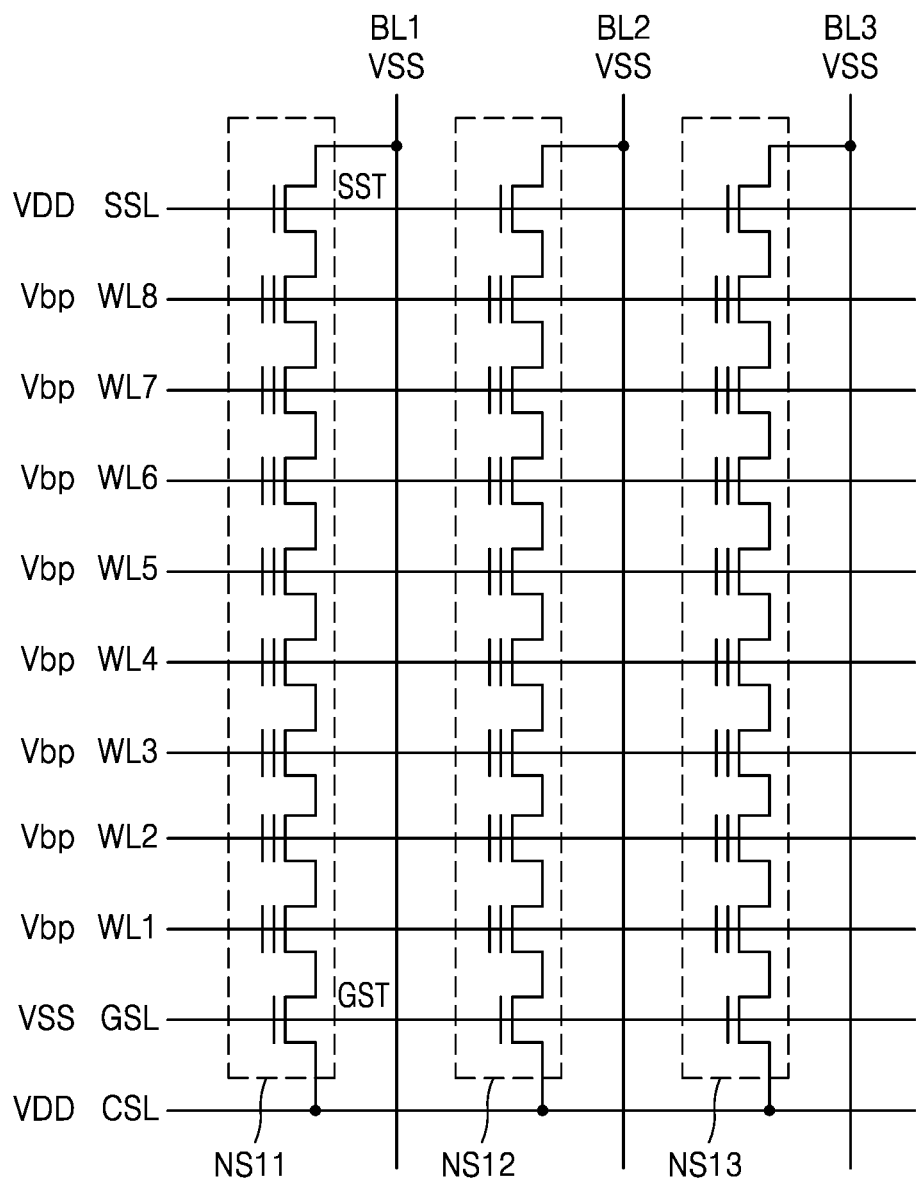
FIG. 10 is a diagram illustrating a block program operation of a non-volatile memory device according to an example embodiment.

However, in the non-volatile memory device 140 according to the present example embodiment, as the block program operation described below with reference to FIGS. 5, 6, and 10 is performed, the lateral charge migration phenomenon may be reduced and the retention characteristics may be improved. Accordingly, a non-volatile memory device with improved reliability may be provided. Hereinafter, the block program operation is described in detail.

FIG. 5 is a flowchart illustrating an operating method of a storage device according to an example embodiment. In detail, FIG. 5 is a diagram for describing a block program operation performed in the non-volatile memory device 140 in FIG. 1. Hereinafter, descriptions are made with reference to FIGS. 1 to 4.

Referring to FIG. 5, the block program operation may include Operations S10, S20, S30, S40, S50, and S60. The block program operation may be performed in units of memory blocks.

In Operation S10, the controller 130 may determine whether the non-volatile memory device 140 satisfies a block program condition based on metadata stored in the metadata buffer MBF. For example, the controller 130 may determine whether the non-volatile memory device 140 satisfies a block program condition based the erase count EC, deterioration degree information, block program flag BPF, and the like of each memory block, stored in the metadata buffer MBF. The block program condition is described in detail below with reference to FIG. 6.

In Operation S20, when the non-volatile memory device 140 satisfies a block program condition, the controller 130 may check whether there is dummy data in a memory block (hereinafter, referred to as the first memory block BLK1) on which a block program operation is to be performed. The dummy data may refer to data from which mapping information between an LBA and a PBA is deleted. The dummy data may be generated as the controller 130 deletes or changes mapping information between an LBA received from the host device 110 by executing firmware such as a flash translation layer (FTL), and a PBA which is an address of memory cells.

In Operation S30, when there is no dummy data in the first memory block BLK1, the non-volatile memory device 140 may perform a block program operation. The block program operation may be a program operation performed in units of memory blocks. That is, a block program voltage Vbp may be applied to all memory cells MCs included in all the cell strings NS11 to NS33 in the first memory block BLK1.

The block program operation may be performed a plurality of times and may be continuously performed. That is, the block program voltage Vbp is applied to all the memory cells MCs in the first memory block BLK1, but may be continuously applied a plurality of times. For example, the block program operation may be continuously performed three or more times. However, embodiments are not limited thereto, and the block program operation may be continuously performed five or more times. The voltage level of the block program voltage Vbp may be the same as the voltage level of a program voltage Vpgm applied to a memory cell during a program operation.

By performing the block program operation, electrons may be supplied to all the memory cells MCs in the first memory block BLK1. Accordingly, holes accumulated in the charge storage layer CS may recombine with electrons supplied through the block program operation. That is, holes accumulated in the charge storage layer CS may be removed by supplying electrons to the charge storage layer CS. In this case, as the block program operation is performed a plurality of times, electrons may be trapped in each of the memory cells MCs, and the amount of trapped charges may be different for each of the memory cells MCs.

In Operation S40, after the block program operation is completely performed, the controller 130 may update the block program flag BPF stored in the metadata buffer MBF. The controller 130 may change the block program flag BPF stored in the metadata buffer MBF from 'FALSE' to 'TRUE'. Accordingly, the non-volatile memory device 140 may not perform a block program operation.

In Operation S50, when the non-volatile memory device 140 does not satisfy a block program condition or the first memory block BLK1 includes dummy data even though the non-volatile memory device 140 satisfies the block program condition, the non-volatile memory device 140 may perform an erase operation. As the non-volatile memory device 140 performs the erase operation, electrons trapped in the charge storage layer CS of the memory cells MCs in the first memory block BLK1 may be removed.

After the erase operation is performed, the controller 130 may update the erase count EC of the memory block stored in the metadata buffer MBF. That is, the controller 130 may store a value obtained by adding 1 to the erase count EC as a new erase count in the metadata buffer MBF.

If it is determined, in Operation S60, that the first memory block BLK1, on which the erase operation has been performed, has satisfied the block program condition in Operation S10, block programming may be performed according to Operation S30. If it is determined that the first memory block BLK1, on which the erase operation has been performed, has not satisfied the block program condition in Operation S10, the procedure may be terminated.

FIG. 6 is a flowchart illustrating an operating method of a storage device according to an example embodiment. In detail, FIG. 6 is a diagram for describing Operation S10 in FIG. 5. Hereinafter, descriptions are made with reference to FIGS. 1 to 5.

Referring to FIG. 6, Operation S10 may include Operations S11, S12, S13, and S14. Operations S11, S12, and S13 may mean block program conditions, respectively. Operation S11 may be referred to as a first condition, Operation S12 may be referred to as a second condition, and Operation S13 may be referred to as a third condition.

In Operation S11, the controller 130 may determine whether the block program flag BPF among the metadata stored in the metadata buffer MBF is 'FALSE'. When the block program flag BPF is 'FALSE', the non-volatile memory device 140 may perform a block program, and when the block program flag BPF is 'TRUE', the non-volatile memory device 140 may not perform a block program.

In operation S12, the controller 130 may determine whether the non-volatile memory device 140 satisfies a cycle condition. The cycle condition may be set based on the degree of deterioration of the memory cells MCs. The cycle condition may be set based on metadata. The cycle condition may be determined using metadata for determining deterioration of the memory cells MCs. The cycle condition may be set in various ways.

For example, the cycle condition may be determined based on the erase count EC among the metadata stored in the metadata buffer MBF. The cycle condition may be set to be satisfied when the erase count EC matches a preset value. For example, the cycle condition may be set to be satisfied when the erase count EC is equal to 100N, where N is a natural number equal to or greater than 1. That is, the cycle condition may be set to be satisfied whenever the erase count EC is a multiple of 100. In this case, the controller 130 may control the non-volatile memory device 140 to perform a block program operation when the erase count EC is a multiple of 100. However, this is only an example, and a cycle condition based on the erase count EC may be variously set.

For example, when the non-volatile memory device 140 performs a program operation by using an incremental step pulse program (ISPP) method of repeatedly programming while increasing the voltage level of the program voltage Vpgm step by step, the cycle condition may be determined according to the number of times the program voltage Vpgm is applied to form a desired threshold voltage distribution of the memory cells MCs. The number of times the program voltage Vpgm is applied may be referred to as a 'loop count'. The loop count may be stored as metadata in the metadata buffer MBF in FIG. 1. As a memory cell deteriorates due to a lateral charge migration phenomenon, the loop count may decrease. Therefore, a cycle condition may be set such that a block program operation is performed when the loop count is less than or equal to a preset value or when the loop count is a preset value.

For example, the cycle condition may be determined based on a certain specification of the non-volatile memory device 140. For example, based on a certain specification for determining the deterioration of the non-volatile memory device 140, the non-volatile memory device 140 may be set such that a block program operation is performed whenever the certain specification deteriorates by a certain amount (e.g., 5%, 10%, etc. of a reference). The certain specification may be determined through the deterioration degree information among the metadata stored in the metadata buffer MBF, but is not limited thereto.

For example, the cycle condition may be determined through a one-shot program operation. The cycle condition may be determined according to the number of deteriorated memory cells found when the non-volatile memory device 140 performs a one-shot program operation. The one-shot program operation may be an operation of programming a plurality of logical page data at once when the memory cells MCs are MLCs, TLCs, or QLCs. The cycle condition may be determined by checking the number of off-cells by performing a one-shot program operation before the non-volatile memory device 140 deteriorates, and by comparing, with the checked number of off-cells, the number of off-cells changed by performing a one-shot program operation after the non-volatile memory device 140 deteriorates. For example, the cycle condition may be set such that a block program operation is performed whenever the number of off-cells increases by a certain ratio.

Although various embodiments for determining the cycle condition have been described, the embodiments are merely examples. Accordingly, embodiments of the present disclosure are not limited thereto, and the cycle condition may be variously set.

In Operation S13, the controller 130 may determine whether the non-volatile memory device 140 is in operation. For example, because the non-volatile memory device 140 operates based on a command CMD received from the controller 130, when the non-volatile memory device 140 does not receive any command CMD from the controller 130, the controller 130 may determine that the non-volatile memory device 140 does not operate.

In Operation S14, the controller 130 may determine whether a block program condition is satisfied. In Operations S11, S12, and S13, when the block program flag BPF is "FALSE", the cycle condition is satisfied, the non-volatile memory device 140 does not receive any command, and memory blocks are not programmed, the controller 130 may determine that the block program condition is satisfied. In Operations S11, S12, and S13, when the block program flag BPF is 'TRUE', the cycle condition is not satisfied, or the non-volatile memory device 140 operates, the controller 130 may determine that the block program condition is not satisfied.

Hereinafter, an example operation of the storage device is described in order to help the understanding of the operating method of the storage device described with reference to FIGS. 5 and 6.

Figure 7:
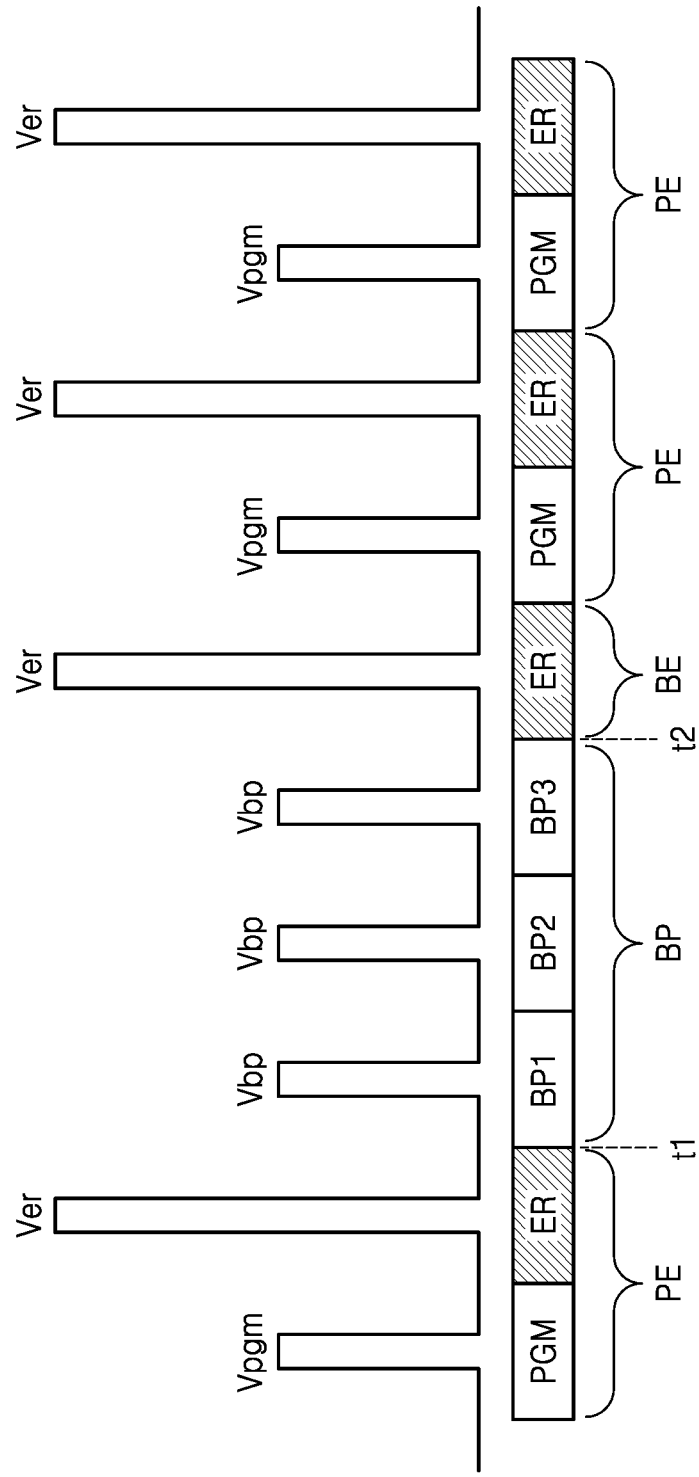
FIG. 7 is a diagram illustrating an operation of a storage device according to an example embodiment.
Figure 8:
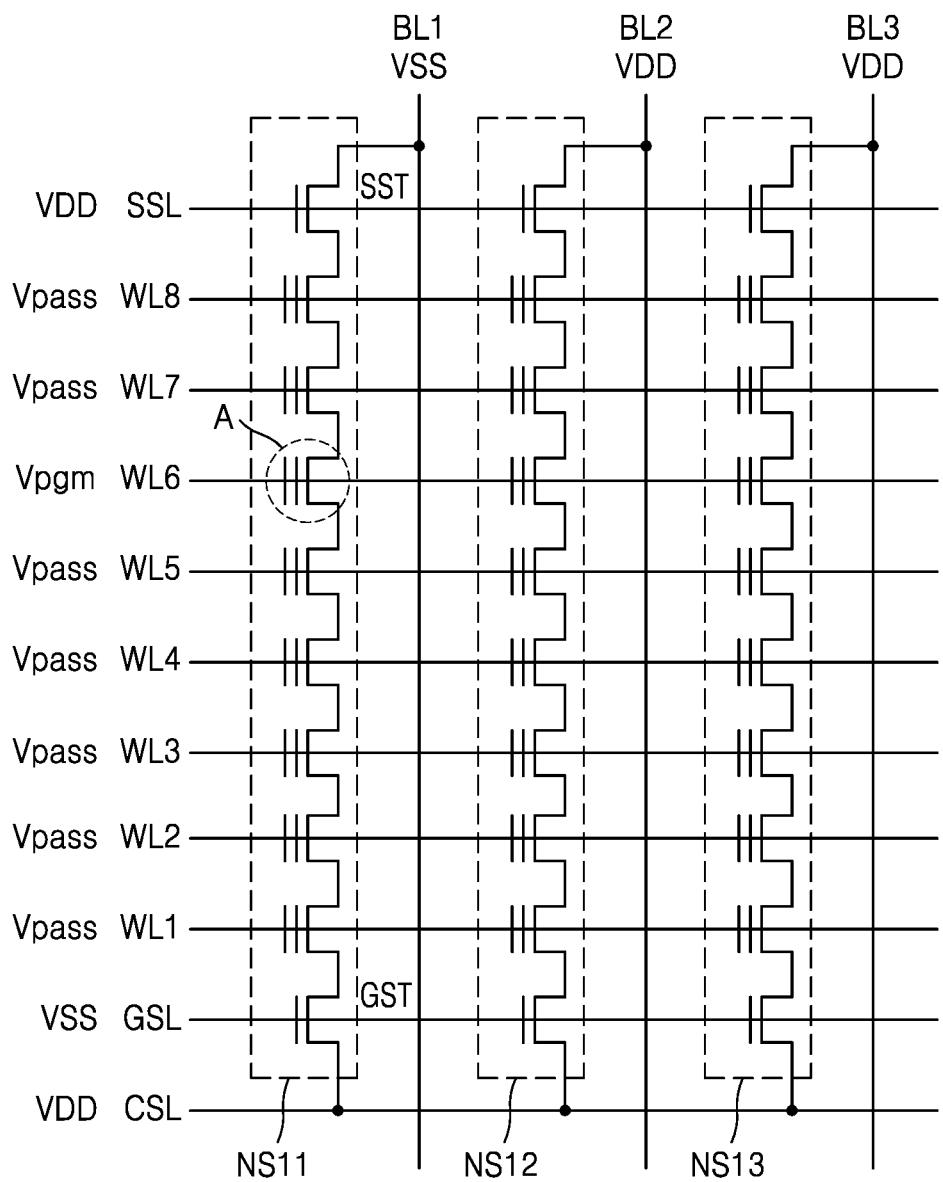
FIG. 8 is a diagram illustrating a program operation of a non-volatile memory device according to an example embodiment.
Figure 9:
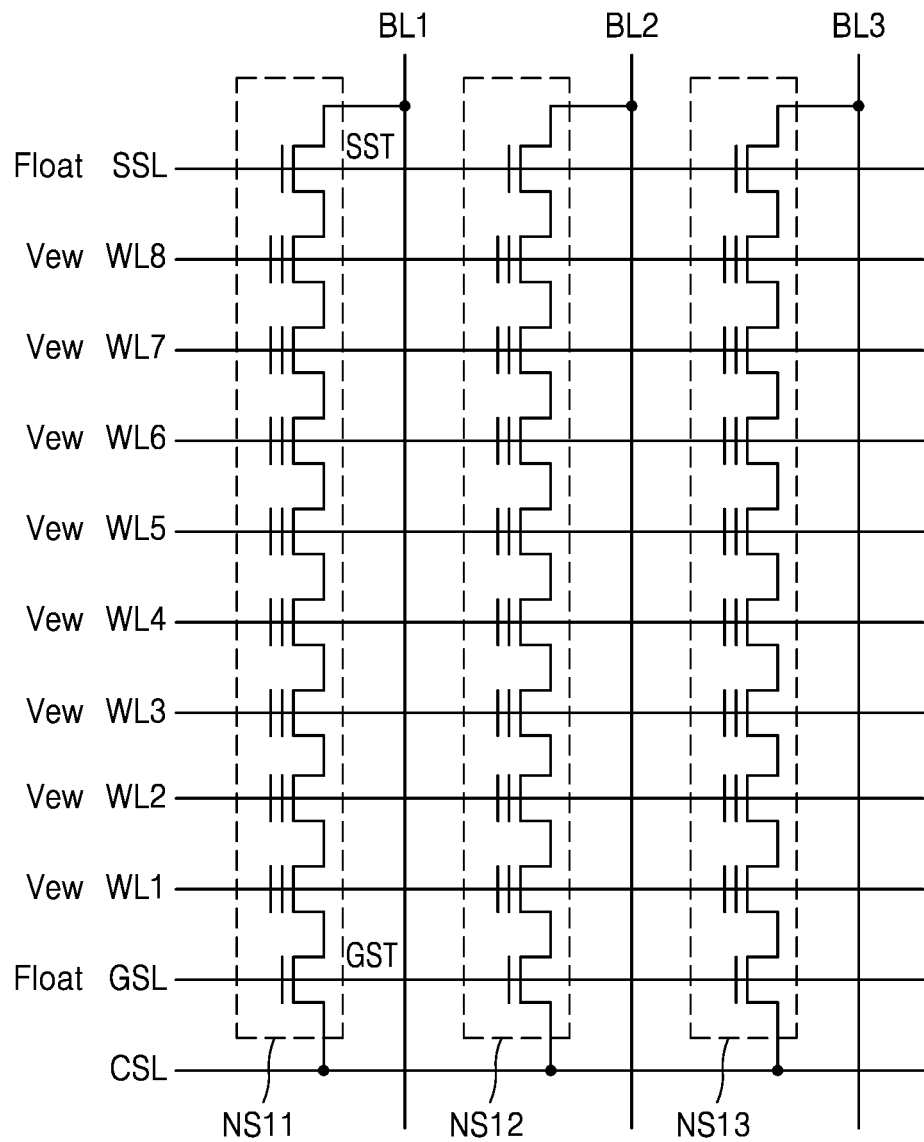
FIG. 9 is a diagram illustrating an erase operation of a non-volatile memory device according to an example embodiment.

FIG. 7 is a diagram illustrating an operation of a storage device according to an example embodiment. FIG. 8 is a diagram illustrating a program operation of a non-volatile memory device according to an example embodiment, FIG. 9 is a diagram illustrating an erase operation of a non-volatile memory device according to an example embodiment, and FIG. 10 is a diagram illustrating a block program operation of a non-volatile memory device according to an example embodiment. In detail, FIG. 7 is an example of the operation of the storage device 120 described with reference to FIGS. 5 and 6, and is a diagram for helping the understanding of FIGS. 5 and 6. FIGS. 8 to 10 are diagrams for describing operations of the non-volatile memory device 140 of FIGS. 1 to 4. Hereinafter, descriptions are made with reference to FIGS. 1 to 6.

Referring to FIG. 7, the storage device 120 may perform a program operation PGM, an erase operation ER, and a block program operation BP. Specifically, the non-volatile memory device 140 may perform a program operation PGM, an erase operation ER, and a block program operation BP based on the control of the controller 130. In the present example embodiment, the non-volatile memory device 140 is illustrated as first performing the program operation PGM among the above operations, but is not limited thereto. In addition, although the level of a voltage applied to the non-volatile memory device 140 to perform each operation is illustrated in FIG. 7, this may refer to an absolute value of the voltage level, and the magnitude of each voltage level is not limited thereto as one of embodiments. FIG. 7 illustrates block program operation BP extending from a time t1 to a time t2.

The non-volatile memory device 140 may apply a program voltage Vpgm to a memory cell to be programmed to perform the program operation PGM. The program operation PGM is described in more detail with reference to FIG. 8.

Referring to FIG. 8, the non-volatile memory device 140 may apply a ground voltage VSS to a selected bit line (hereinafter, referred to as a first bit line BL1) in order to perform a program operation PGM, and may apply a power supply voltage VDD to unselected bit lines (hereinafter, referred to as a second bit line BL2 and a third bit line BL3). At the same time, the non-volatile memory device 140 may apply a program voltage Vpgm to a selected word line (hereinafter, referred to as a sixth word line WL6), and may apply a pass voltage Vpass to unselected word lines WL1 to WL5 and WL7 to WL8. That is, the non-volatile memory device 140 may apply the program voltage Vpgm in units of word lines or units of physical pages.

Accordingly, a memory cell A in which the selected bit line BL1 and the selected word line WL6 overlap each other may be programmed. That is, electrons may be trapped and stored in a charge storage layer CS of the memory cell A (see the dashed circle in FIG. 8). When the memory cell A is an MLC, in order to accurately control the threshold voltage distribution of the memory cell A, the memory cell A may be programmed by using the ISPP method of programming while increasing the voltage level of the program voltage Vpgm step by step.

The voltage level of the program voltage Vpgm may be higher than the voltage level of the pass voltage Vpass. The voltage level of the program voltage Vpgm and the voltage level of the pass voltage Vpass may be higher than the voltage level of the power supply voltage VDD. For example, the program voltage Vpgm may be about 18 volts (V), the pass voltage Vpass may be about 10V, and the power supply voltage VDD may be about 3V.

Referring back to FIG. 7, the non-volatile memory device 140 may perform an erase operation ER after performing the program operation PGM. The non-volatile memory device 140 may be reprogrammed later by performing the erase operation ER. The program operation PGM and the erase operation ER may constitute a program/erase cycle PE. The erase operation ER is described in more detail with reference to FIG. 9.

Referring to FIG. 9, the non-volatile memory device 140 may float all bit lines BL1 to BL3 to perform an erase operation ER. At the same time, an erase voltage Ver may be applied to the bulk of each of the memory cells, and a word line erase voltage Vew may be applied to all word lines WL1 to WL8. The bulk may refer to a well region of memory cells. The erase voltage Ver may be applied by using an incremental step pulse erase (ISPE) method. A string selection line SSL and ground selection lines GSL may float. Accordingly, a voltage difference may occur between a surface layer S and the word lines WL1 to WL8, and Fowler-Nordheim tunneling may occur in the memory cells MC1 to MC8. Accordingly, electrons trapped in the charge storage layer CS of the memory cell A may be erased. The erase operation ER may be performed in units of memory blocks.

The voltage level of the erase voltage Ver may be higher than the voltage level of the word line erase voltage Vew. The voltage level of the word line erase voltage Vew may be equal to the voltage level of the ground voltage VSS. For example, the erase voltage Ver may be about 20V, and the word line erase voltage Vew may be 0V. The voltage level of the erase voltage Ver may be greater than the voltage level of the program voltage Vpgm.

Referring back to FIG. 7, the non-volatile memory device 140 may satisfy, at a first time point t1, the block program condition described above with reference to FIGS. 5 and 6. That is, in the memory cells MCs of the non-volatile memory device 140, holes may be accumulated in the charge storage layer CS, and thus, the retention characteristics of the memory cells may deteriorate. In the present example embodiment, for convenience of description, a case (Operation S20 in FIG. 5) in which there is no dummy data in the memory cells is illustrated, but embodiments are not limited thereto.

The block program operation BP may be performed a plurality of times and may be continuously performed. For example, the block program operation BP may be performed three or more times. Accordingly, the block program operation BP may include a first block program operation BP1, a second block program operation BP2, and a third block program operation BP3. FIG. 7 illustrates a case in which the block program operation BP is performed three times, but is not limited thereto. All of the first to third block program operations BP1 to BP3 may perform the same operation. That is, the block program operation BP may be understood as repeating the first block program operation BP1 three times. Accordingly, the first block program operation BP1 is described in more detail with reference to FIG. 10.

Referring to FIG. 10, the non-volatile memory device 140 may apply the ground voltage VSS to all bit lines BL1 to BL3 of a memory block to perform the first block program operation BP1. At the same time, the non-volatile memory device 140 may apply the block program voltage Vbp to all word lines WL1 to WL8 of the memory block. That is, the non-volatile memory device 140 may perform the first block program operation BP1 in units of memory blocks. The voltage level of the block program voltage Vbp may be equal to the voltage level of the program voltage Vpgm. The voltage level of the block program voltage Vbp may be lower than the voltage level of the erase voltage Ver.

As the first block program operation BP1 is performed, all memory cells of the memory block may be programmed. That is, electrons may be provided to a charge storage layer CS of all memory cells, and the provided electrons may be erased by recombination with holes accumulated in each charge storage layer CS. Because holes accumulated in the memory cell are removed through the first block program operation BP1, a lateral charge migration phenomenon may be reduced and retention characteristics may be improved.

Referring back to FIG. 7, the block program operation BP may be terminated at a second time point t2. At the second time point t2, the non-volatile memory device 140 may be in a state in which holes accumulated in the charge storage layer CS are removed. The non-volatile memory device 140 may remove electrons, which remain in the charge storage layer CS of the memory cells due to the block program operation BP performed a plurality of times, by performing the erase operation ER. An erase operation performed after the block program operation BP is terminated may be referred to as a 'block erase operation BE'. Accordingly, the block erase operation BE may operate like the erase operation ER described with reference to FIG. 9. The block erase operation BR may refer to an erase operation not included in a program/erase cycle PE.

Thereafter, the program/erase cycle PE may be repeated. The program/erase cycle PE may be repeated until the block program condition described with reference to FIGS. 5 and 6 is satisfied. Accordingly, the block program operation BP may be selectively performed only when the memory cells deteriorate.

Figure 11:
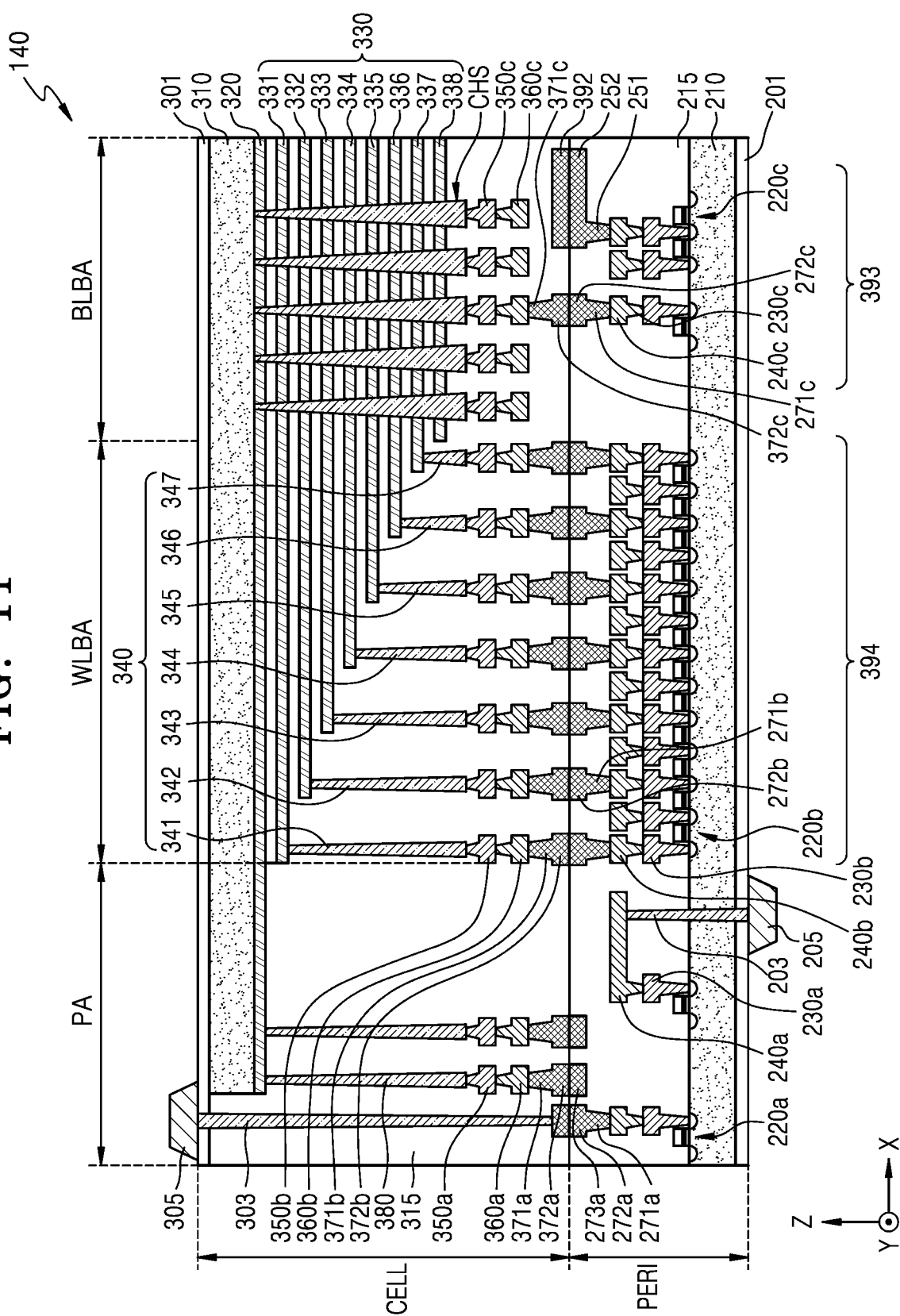
FIG. 11 is a cross-sectional view illustrating a structure of a non-volatile memory device according to an example embodiment.

FIG. 11 is a cross-sectional view illustrating a structure of a non-volatile memory device according to an example embodiment. In detail, FIG. 11 is a diagram for describing the structure of the non-volatile memory device 140 of FIGS. 1 and 2. Hereinafter, the structure of the non-volatile memory device 140 is described with reference to FIGS. 1 and 2.

Referring to FIG. 11, the non-volatile memory device 140 may include a peripheral circuit region PERI and a cell region CELL. Each of the peripheral circuit region PERI and the cell region CELL may include an external pad bonding area PA, a word line bonding area WLBA, and a bit line bonding area BLBA.

The non-volatile memory device 140 may have a chip-to-chip (C2C) structure. The C2C structure may refer to a structure formed by manufacturing an upper chip including a cell region CELL on a first wafer, manufacturing a lower chip including a peripheral circuit region PERI on a second wafer that is different from the first wafer, and then bonding the upper chip and the lower chip to each other. In this case, the bonding method may refer to a method of electrically connecting a bonding metal formed on an uppermost metal layer of the upper chip to a bonding metal formed on an uppermost metal layer of the lower chip. For example, when the bonding metal includes copper (Cu), the bonding method may be a Cu—Cu bonding method. In another example embodiment, the bonding metal may include not only Cu but also aluminum (Al) or tungsten (W).

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may include tungsten having a relatively high electrical resistivity, and the second metal layers 240a, 240b, and 240c may include copper having a relatively low electrical resistivity.

Although FIG. 11 shows only the first metal layers 230a, 230b, and 230c and the second metal layers 240a, 240b, and 240c, embodiments are not limited thereto, and one or more metal layers may be further formed on the second metal layers 240a, 240b, and 240c. At least some of the one or more metal layers formed on the second metal layers 240a, 240b, and 240c may include Al or the like having an electrical resistivity lower than that of Cu forming the second metal layers 240a, 240b, and 240c.

The interlayer insulating layer 215 may be arranged on the first substrate 210 to cover the plurality of circuit elements 220a, 220b, and 220c, the first metal layers 230a, 230b, and 230c, and the second metal layers 240a, 240b, and 240c, and may include an insulating material such as silicon oxide or silicon nitride.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to the upper bonding metals 371b and 372b in the cell region CELL by a bonding method. The lower bonding metals 271b and 272b and the upper bonding metals 371b and 372b may include Al, Cu, W, or the like.

The cell region CELL may provide at least one memory block. The cell region CELL may include a second substrate 310 and a common source line 320. On the second substrate 310, word lines 330 may be stacked in a direction (a Z-axis direction) perpendicular to the top surface of the second substrate 310. String selection lines and ground selection lines may be arranged above and below the word lines 330, respectively, and a plurality of word lines 330 may be arranged between the string selection lines and the ground selection line.

In the bit line bonding area BLBA, a channel structure CHS may extend in the direction (the Z-axis direction) perpendicular to the top surface of the second substrate 310 and pass through the word lines 330, the string selection lines, and the ground selection lines. The channel structure CH may include a data storage layer, a channel layer, a buried insulating layer, and the like. The channel layer may be electrically connected to a first metal layer 350c and a second metal layer 360c. For example, the first metal layer 350c may be a bit line contact, and the second metal layer 360c may be a bit line. The second metal layer 360c (hereinafter, referred to as a bit line 360c) may extend in a direction (a Y-axis direction) parallel to the top surface of the second substrate 310.

An area in which the channel structure CH and the bit line 360c are arranged may be defined as a bit line bonding area BLBA. The bit line 360c may be electrically connected to the circuit elements 220c constituting a page buffer 393. For example, the bit line 360c may be connected to upper bonding metals 371c and 372c in the peripheral circuit region PERI, and the upper bonding metals 371c and 372c may be connected to lower bonding metals 271c and 272c connected to the circuit elements 220c of the page buffer 393. The page buffer 393 may correspond to the page buffer 144 described above with reference to FIG. 2.

In the word line bonding area WLBA, the word lines 330 may extend in a second direction (an X-axis direction) perpendicular to a first direction (the Y-axis direction) and parallel to the top surface of the second substrate 310, and may be connected to a plurality of cell contact plugs 340 (including contact plug 341, contact plug 342, contact plug 343, contact plug 344, contact plug 345, contact plug 346 and contact plug 347). The word lines 330 and the cell contact plugs 340 may be connected to each other through pads provided as at least some of the word lines 330 extend to have different lengths in the second direction. A first metal layer 350*b* and a second metal layer 360*b* may be sequentially connected to upper portions of the cell contact plugs 340 connected to the word lines 330. In the word line bonding area WLBA, the cell contact plugs 340 may be connected to the peripheral circuit region PERI through the upper bonding metals 371*b* and 372*b* in the cell region CELL and the lower bonding metals 271*b* and 272*b* in the peripheral circuit region PERI.

The cell contact plugs 340 may be electrically connected to the circuit elements 220*b* constituting a row decoder 394. The operating voltages of the circuit elements 220*b* may be different from the operating voltages of the circuit elements 220*c* constituting the page buffer 393. For example, the operating voltages of the circuit elements 220*b* may be lower than the operating voltages of the circuit elements 220*c*. The row decoder 394 may correspond to the row decoder 142 in FIG. 2.

A common source line contact plug 380 may be arranged in the external pad bonding area PA. The common source line contact plug 380 may include a conductive material (e.g., a metal, a metal compound, or polysilicon) and may be electrically connected to the common source line 320. A first metal layer 350*a* and a second metal layer 360*a* may be sequentially stacked on the common source line contact plug 380. An area in which the common source line contact plug 380, the first metal layer 350*a*, and the second metal layer 360*a* are arranged may be defined as an external pad bonding area PA.

The external pad bonding area PA may include first and second input/output pads 205 and 305. A lower insulating layer 201 covering a lower surface of the first substrate 210 may be formed under the first substrate 210, and the first input/output pad 205 may be formed on the lower insulating layer 201. The first input/output pad 205 may be connected to at least one of the plurality of circuit elements 220*a*, 220*b*, and 220*c* arranged in the peripheral circuit region PERI through a first input/output contact plug 203, and may be separated from the first substrate 210 by the lower insulating layer 201. In addition, a side insulating layer may be arranged between the first input/output contact plug 203 and the first substrate 210 to electrically separate the first input/output contact plug 203 from the first substrate 210.

An upper insulating layer 301 covering the top surface of the second substrate 310 may be formed on the second substrate 310, and a second input/output pad 305 may be arranged on the upper insulating layer 301. The second input/output pad 305 may be connected, through a second input/output contact plug 303, to at least one of the plurality of circuit elements 220*a*, 220*b*, and 220*c* arranged in the peripheral circuit region PERI. In an embodiment, the second input/output pad 305 may be electrically connected to the circuit element 220*a*.

The second substrate 310 and the common source line 320 may not be arranged in a region where the second input/output contact plug 303 is arranged. Also, the second input/output pad 305 may not overlap the word lines 330 in a third direction (the Z-axis direction). The second input/output contact plug 303 may be separated from the second substrate 310 in a direction parallel to the top surface of the second substrate 310, and may be connected to the second input/output pad 305 through the interlayer insulating layer 315 in the cell region CELL.

According to an example embodiment, the first input/output pad 205 and the second input/output pad 305 may be selectively formed. For example, the non-volatile memory device 140 may include only the first input/output pad 205 arranged on the first substrate 210, or the second input/output pad 305 arranged on the second substrate 310. Alternatively, the non-volatile memory device 140 may include both the first input/output pad 205 and the second input/output pad 305.

In each of the external pad bonding area PA and the bit line bonding area BLBA included in each of the cell region CELL and the peripheral circuit region PERI, a metal pattern of the uppermost metal layer may be provided as a dummy pattern, or the uppermost metal layer may be absent.

In the external pad bonding area PA, the non-volatile memory device 140 may include a lower metal pattern 273*a* corresponding to an upper metal pattern 372*a* formed on an uppermost metal layer of the cell region CELL, the lower metal pattern 273*a* being formed on an uppermost metal layer of the peripheral circuit region PERI and having the same shape as the upper metal pattern 372*a* of the cell region CELL. The lower metal pattern 273*a* formed on the uppermost metal layer of the peripheral circuit region PERI may not be connected to a separate contact in the peripheral circuit region PERI. Similarly, in the external pad bonding area PA, an upper metal pattern 372*a*, corresponding to the lower metal pattern 273*a* formed on the uppermost metal layer of the peripheral circuit region PERI and having the same shape as the lower metal pattern 273*a* of the peripheral circuit region PERI, may be formed on the uppermost metal layer of the cell region CELL.

The lower bonding metals 271*b* and 272*b* may be formed on the second metal layer 240*b* in the word line bonding area WLBA. In the word line bonding area WLBA, the lower bonding metals 271*b* and 272*b* in the peripheral circuit region PERI may be electrically connected to the upper bonding metals 371*b* and 372*b* in the cell region CELL by a bonding method.

In addition, in the bit line bonding area PA, an upper metal pattern 392, corresponding to a lower metal pattern 252 formed on the uppermost metal layer of the peripheral circuit region PERI and having the same shape as the lower metal pattern 252 of the peripheral circuit region PERI, may be formed on the uppermost metal layer of the cell region CELL. A contact may not be formed on the upper metal pattern 392 formed on the uppermost metal layer of the cell region CELL.

Figure 12:
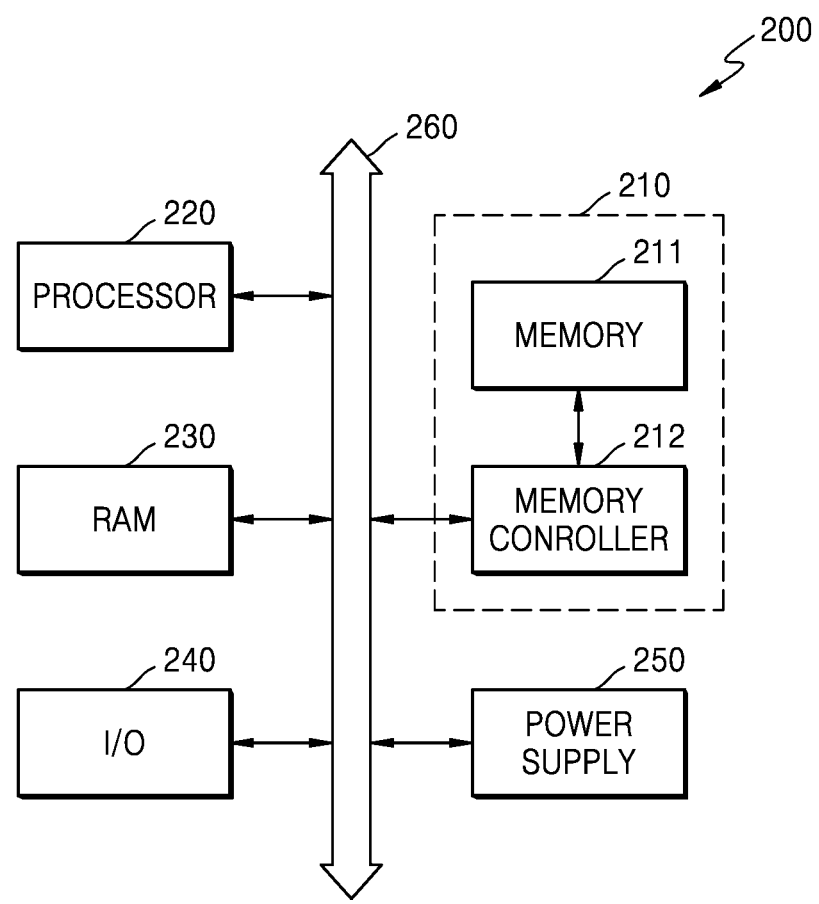
FIG. 12 is a block diagram of a computing system according to an example embodiment.

FIG. 12 is a block diagram of a computing system 200 according to an example embodiment.

Referring to FIG. 12, the computing system 200 may include a memory system 210, a processor 220, a RAM 230, an input/output device 240, and a power supply 250. Although not shown in FIG. 11, the computing system 200 may further include ports capable of communicating with a video card, a sound card, a memory card, a USB device, etc., or communicating with other electronic devices. The computing system 200 may be implemented as a personal computer or as a portable electronic device such as a notebook computer, a mobile phone, a personal digital assistant (PDA), or a camera.

The processor 220 may perform certain calculations or tasks. According to an example embodiment, the processor 220 may be a micro-processor or a central processing unit (CPU). The processor 220 may communicate with the RAM 230, the input/output device 240, and the memory system 210 through a bus 260 such as an address bus, a control bus, and a data bus. In an example embodiment, the processor 220 may also be connected to an expansion bus such as a Peripheral Component Interconnect (PCI) bus.

The memory system 210 may communicate with the processor 220, the RAM 230, and the input/output device 240 through the bus 260. The memory system 210 may store received data or provide the stored data to the processor 220, the RAM 230, or the input/output device 240 according to a request from the processor 220.

The memory system 210 may be the memory system 100 described with reference to FIG. 1. The memory system 210 may include a memory 211 and a memory controller 212. The memory 211 may correspond to the non-volatile memory device 140 described with reference to FIGS. 2 to 10. That is, the memory system 210 may include the non-volatile memory device 140 described with reference to FIGS. 2 to 10.

The memory 211 may operate under the control of the memory controller 212, according to the operating method according to the example embodiment described with reference to FIGS. 5 to 10. For example, the memory 211 may selectively perform a block program operation only when a block program condition is satisfied. The block program operation may be continuously performed a plurality of times. The memory controller 212 may determine whether the memory 211 satisfies a block program condition, and may control a block program operation based on the determination. As the memory 211 performs the block program operation, a lateral charge migration phenomenon of the memory 211 may be reduced, and the memory system 210 with improved reliability may be provided.

The RAM 230 may store data necessary for the operation of the computing system 200. For example, the RAM 230 may be implemented as DRAM, mobile DRAM, SRAM, PRAM, FRAM, RRAM, and/or MRAM.

The input/output device 240 may include input units such as a keyboard, a keypad, and a mouse, and output units such as a printer and a display. The power supply 250 may supply an operating voltage necessary for the operation of the computing system 200.

Figure 13:
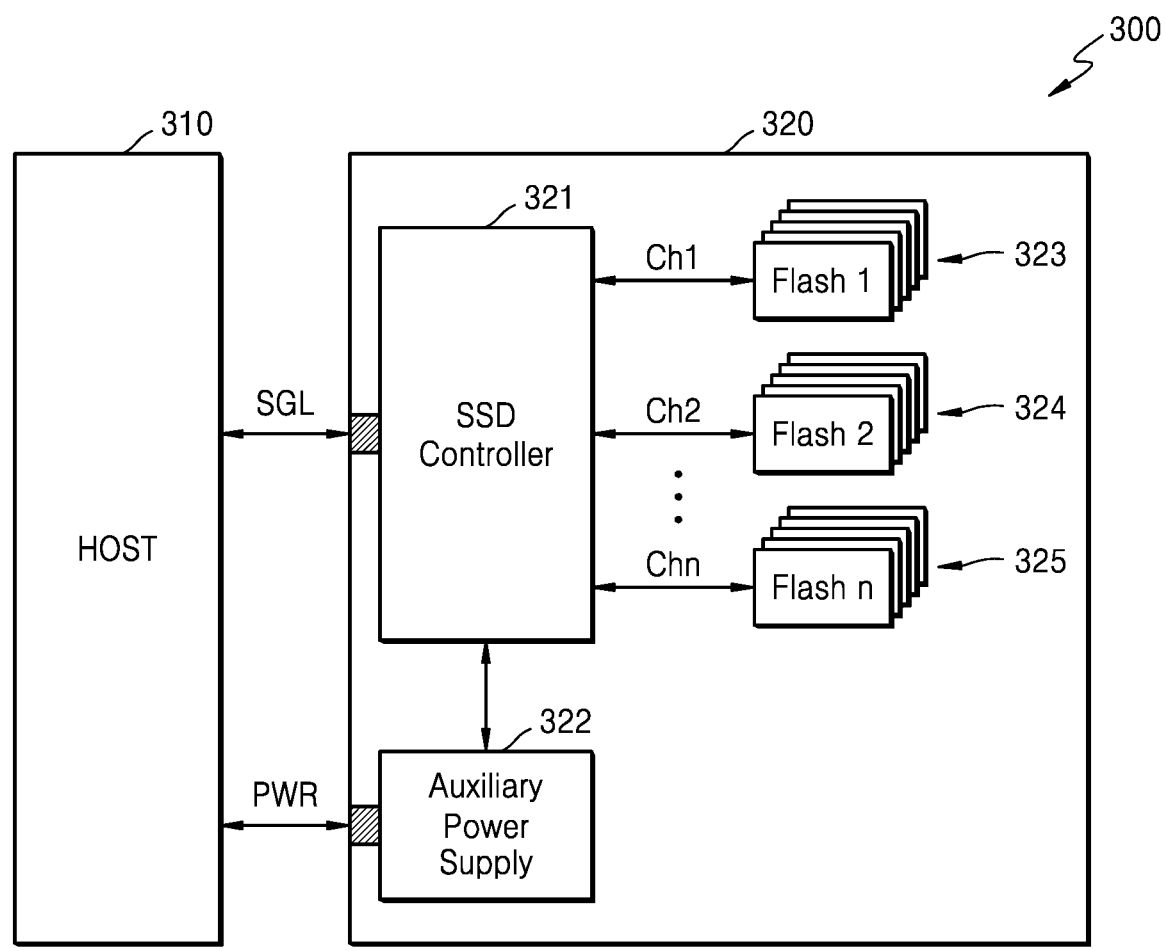
FIG. 13 is a block diagram of a solid-state drive (SSD) system according to an example embodiment.

FIG. 13 is a block diagram of an SSD system 300 according to an example embodiment.

Referring to FIG. 13, the SSD system 300 may include a host 310 and an SSD 320. The SSD 320 may transmit and receive signals to and from the host 310 through a signal connector, and may receive power through a power connector.

The SSD 320 may include an SSD controller 321, an auxiliary power supply 322, and a plurality of memory devices 323, 324, and 325. The plurality of memory devices 323, 324, and 325 may be vertically stacked NAND flash memory devices. At least one of the plurality of memory devices 323, 324, and 325 may include the non-volatile memory device 140 described with reference to FIGS. 2 to 4. Specifically, at least one of the plurality of memory devices 323, 324, and 325 may perform a block program operation based on the control of the SSD controller 321, according to the operating method according to the example embodiment described with reference to FIGS. 5 to 10. Accordingly, retention characteristics of a memory device that performs a block program operation from among the plurality of memory devices 323, 324, and 325 may be improved, and the SSD system 300 with improved reliability may be provided.

While example embodiments been particularly shown and described, it will be understood that various changes in form and details may be made therein without departing from the spirit and scope of the following claims.

What is claimed is:

1. An operating method of a semiconductor device including a controller and a non-volatile memory device operating under control of the controller, the operating method comprising:
   determining, by the controller, whether the non-volatile memory device satisfies a block program condition, wherein the block program condition is based on an erase count of a memory block and a number of deteriorated memory cells identified by performing a one-shot program operation;
   based on the non-volatile memory device satisfying the block program condition, performing a block program operation a plurality of times, wherein the block program operation is associated with removing excess holes; and
   based the non-volatile memory device not satisfying the block program condition, performing an erase operation, wherein the erase operation is associated with removing excess electrons.

2. The operating method of claim 1, wherein the determining whether the non-volatile memory device satisfies the block program condition comprises:
   checking whether a block program flag stored in the controller is 'FALSE'; and
   checking whether the non-volatile memory device satisfies a cycle condition based on metadata stored in the controller.

3. The operating method of claim 2, wherein the metadata comprises a loop count of the non-volatile memory device, and
   the cycle condition is set based on the metadata.

4. The operating method of claim 2, wherein the determining whether the non-volatile memory device satisfies the block program condition further comprises:
   checking whether the non-volatile memory device is operating.

5. The operating method of claim 1, wherein the continuously performing the block program operation comprises:
   continuously performing at least three times the block program operation.

6. The operating method of claim 1, further comprising:
   checking whether dummy data is present in the memory block on which the block program operation is to be performed, with respect to the non-volatile memory device satisfying the block program condition;
   based on the dummy data being present in the memory block, performing the block program operation after the performing of the erase operation; and
   based on the dummy data not being present in the memory block, omitting the erase operation and performing the block program operation.

7. The operating method of claim 1, further comprising:
   performing a block erase operation after the continuously performing the block program operation the plurality of times; and
   after the performing the block erase operation, repeating a program/erase cycle until the block program condition is satisfied.

8. The operating method of claim 1, wherein the block program operation is performed by applying a block program voltage to all memory cells in the memory block on which the block program operation is to be performed.

9. The operating method of claim 8, wherein a first voltage level of the block program voltage is equal to a second voltage level of a program voltage applied to the non-volatile memory device when the non-volatile memory device performs a program operation.

10. The operating method of claim 8, wherein a first voltage level of the block program voltage is lower than a second voltage level of an erase voltage applied to the non-volatile memory device when the erase operation is performed,
wherein the block program operation is configured to remove the excess holes, whereby the excess holes accumulated in a first charge storage layer are removed by supplying electrons to the first charge storage layer, and
wherein the erase operation is configured to remove the excess electrons, whereby the excess electrons trapped in a second charge storage layer are removed.

11. A semiconductor device comprising: a controller including a metadata buffer configured to store metadata; and a non-volatile memory device configured to perform an operation based on control of the controller,
wherein the controller is configured to determine whether the non-volatile memory device satisfies a block program condition, wherein the block program condition is based on an erase count of a memory block and a number of deteriorated memory cells identified by performing a one-shot program operation,
wherein the erase count refers to a count of an erase operation, and the erase operation is associated with removing excess electrons, and
wherein the non-volatile memory device is configured to, based on the block program condition being satisfied, continuously perform at least three times a block program operation, wherein the block program operation is associated with removing excess holes.

12. The semiconductor device of claim 11, wherein the metadata comprises at least one of a block program flag, a loop count, and
wherein the block program condition comprises at least one of a first condition for determining whether the block program flag is 'FALSE', a second condition for determining whether a cycle condition is satisfied based on the metadata, and a third condition for determining whether the non-volatile memory device is operating.

13. The semiconductor device of claim 12, wherein the controller is further configured to:
update the block program flag from 'FALSE' to 'TRUE' after the non-volatile memory device performs the block program operation, and
update the erase count after the non-volatile memory device performs the erase operation.

14. The semiconductor device of claim 11, wherein the non-volatile memory device is further configured to, based on the block program condition being satisfied and dummy data being present in the memory block on which the block program operation is to be performed, continuously perform the block program operation after performing the erase operation.

15. The semiconductor device of claim 11, wherein the non-volatile memory device is further configured to perform the block program operation by applying a block program voltage to all memory cells in the memory block on which the block program operation is to be performed, and
wherein a first voltage level of the block program voltage is equal to a second voltage level of a program voltage applied to the non-volatile memory device when the non-volatile memory device performs a program operation.

16. The semiconductor device of claim 11, wherein the non-volatile memory device is further configured to perform a block erase operation after the performing of the block program operation.

17. A non-volatile memory device comprising memory cells each storing data of at least two bits, wherein the non-volatile memory device is configured to:
based on a block program condition being satisfied, wherein the block program condition is based on an erase count of a memory block and a number of deteriorated memory cells identified by performing a one-shot program operation, continuously perform a block program operation a plurality of times by applying a block program voltage to first memory cells in a selected memory block the plurality of times, wherein the block program operation is associated with removing excess holes, and
after the performing of the block program operation the plurality of times, perform a block erase operation by applying an erase voltage to a bulk of the first memory cells in the selected memory block, wherein the block erase operation is associated with removing excess electrons.

18. The non-volatile memory device of claim 17, wherein the non-volatile memory device is further configured to perform at least three times the block program operation.

19. The non-volatile memory device of claim 17, wherein the block program condition comprises at least one of a first condition that is satisfied when a block program flag is 'FALSE', a second condition that is satisfied based on the erase count being a preset value, and a third condition that is satisfied when the non-volatile memory device does not receive a command from the outside.

20. The non-volatile memory device of claim 17, wherein a first voltage level of the block program voltage is lower than a second voltage level of the erase voltage.

* * * * *